(12) United States Patent
Hanna et al.

(10) Patent No.: US 7,329,554 B2
(45) Date of Patent: Feb. 12, 2008

(54) REACTIVE CODOPING OF GAALINP COMPOUND SEMICONDUCTORS

(75) Inventors: Mark Cooper Hanna, Boulder, CO (US); Robert Reedy, Golden, CO (US)

(73) Assignee: Midwest Research Institute, Kansas City, MO (US)

(*) Notice: Subject to any disclaimer, the term of this patent is extended or adjusted under 35 U.S.C. 154(b) by 311 days.

(21) Appl. No.: 10/552,102

(22) PCT Filed: Nov. 8, 2001

(86) PCT No.: PCT/US01/49921

§ 371 (c)(1),
(2), (4) Date: Oct. 3, 2005

(87) PCT Pub. No.: WO03/044840

PCT Pub. Date: May 30, 2003

(65) Prior Publication Data

US 2006/0252242 A1    Nov. 9, 2006

(51) Int. Cl.
*H01L 21/00* (2006.01)
(52) U.S. Cl. .................. 438/46; 257/E21.101
(58) Field of Classification Search .......... 438/46
See application file for complete search history.

(56) References Cited

U.S. PATENT DOCUMENTS

| | | | |
|---|---|---|---|
| 4,963,508 A | 10/1990 | Umeno et al. | |
| 5,002,618 A | 3/1991 | Kanai et al. | |
| 5,264,389 A | 11/1993 | Hamada et al. | |
| 5,744,829 A | 4/1998 | Murasato et al. | |
| 5,944,913 A | 8/1999 | Hou et al. | |
| 5,959,307 A | 9/1999 | Nakamura et al. | |
| 6,100,546 A | 8/2000 | Major et al. | |
| 6,150,604 A | 11/2000 | Freundlich et al. | |
| 6,232,138 B1 | 5/2001 | Fitzgerald et al. | |
| 6,281,426 B1 | 8/2001 | Olson et al. | |
| 6,300,558 B1 | 10/2001 | Takamoto et al. | |

OTHER PUBLICATIONS

Yamada, A. et al., "Ion implantation of isoelectronic impurities into Inp," Nuclear Instruments and Methods in Physics Research B80/81 (1993) 910-914, North Holland.

(Continued)

*Primary Examiner*—Scott B. Geyer
*Assistant Examiner*—Elias Ullah
(74) *Attorney, Agent, or Firm*—Paul J. White

(57) ABSTRACT

A GaAlInP compound semiconductor and a method of producing a GaAlInP compound semiconductor are provided. The apparatus and method comprises a GaAs crystal substrate in a metal organic vapor deposition reactor. Al, Ga, In vapors are prepared by thermally decomposing organometallic compounds. P vapors are prepared by thermally decomposing phospine gas, group II vapors are prepared by thermally decomposing an organometallic group IIA or IIB compound. Group VIB vapors are prepared by thermally decomposing a gaseous compound of group VIB. The Al, Ga, In, P, group II, and group VIB vapors grow a GaAlInP crystal doped with group IIA or IIB and group VIB elements on the substrate wherein the group IIA or IIB and a group VIB vapors produced a codoped GaAlInP compound semiconductor with a group IIA or IIB element serving as a p-type dopant having low group II atomic diffusion.

19 Claims, 3 Drawing Sheets

OTHER PUBLICATIONS

Xin, H.P. et al., "GaN0.011P0.989 red light-emitting diodes directly grown on GaP substrates," Applied Physics Letters, vol. 77, No. 13, Sep. 25, 2000, 1946-1308.

Biwa, Goshi et al., "Metalorganic vapor-phase epitaxy of GaP1-x-yAsyNx quaternary alloys on GaP," Journal of Crystal growth 189/190 (1998) 485-489, Elsevier Science.

McConnell, R.D. and Kapur, V.K. "Photovoltaics for the 21st Century II," Energy Technology Division, Proceedings vol. 2001-10, The Electrochrmical Society, Inc.

Hong, Y.G. and Tu, C.W., "Ga(In)NAs and (Al)GaNP: Potential Materials for Photovotlaics", Electrochemical Society Proceedings vol. 2001-10, 415-423.

Xin, H.P. et al., "Gas-source MBE growth of Ga(In)NP/GaP structures and their applications for red light-emitting diodes," Journal of Crystal Growth, 227-228 (2001) 558-561, Elsevier Science.

REACTIVE CODOPING OF GAALINP COMPOUND SEMICONDUCTORS

CONTRACTUAL ORIGIN OF THE INVENTION

The United States Government has rights in this invention under Contract No. DE-AC36-99GO10337 between the United States Department of Energy and the National Renewal Energy Laboratory, a division of the Midwest Research Institute.

TECHNICAL FIELD

This invention relates generally to a GaAlInP compound semiconductor and the production of GaAlInP compound semiconductors and, more particularly, it relates to reactive codoping of GaAlInP compound semiconductors for improved electrical conductivity and dopant stability in heavily doped layers.

BACKGROUND ART

Semiconductor devices, such as solar cells and LEDs, require regions with differing types (n-type or p-type) and levels of conductivity. Adding impurity atoms, known as dopants, either to add or remove free electrons, varies the conductivity of the semiconductor device. For some semiconductor materials, it is difficult to obtain high p-type conductivity because of the solubility, activation, and diffusion dynamics of the materials in question. Heavy p-type doping of GaAlInP compound semiconductors with high Al content, such as AlInP, is difficult to achieve with single acceptor species such as Zn, Mg, or Be. Therefore, a method for production of GaAlInP compound semiconductors is needed which greatly enhances the incorporation and solubility of acceptor impurities in GaAlInP grown lattice matched to GaAs substrates which is useful with conventional techniques such as metal organic chemical vapor deposition (MOCVD) or molecular beam epitaxy (MBE). It is also desirable that the method produces low resistivity p-type material with the important benefit of reduced atomic diffusion of the acceptor dopants.

DISCLOSURE OF INVENTION

The present invention is a method of producing a GaAlInP compound semiconductor. The method comprising the steps of disposing a GaAs single crystal as a substrate in a metal organic chemical vapor deposition (MOCVD) reactor, preparing Al, Ga, In vapors by thermally decomposing organometallic compounds of Al, Ga, and In, preparing Zn vapors by thermally decomposing an organometallic Zn compound, preparing P vapors by thermally decomposing phosphine gas, simultaneously supplying the Al, Ga, In, P, Se, and Zn vapors to a region for epitaxial crystal growth on the substrate, and epitaxially growing a GaAlInP crystal doped with Zn and Se on the substrate wherein the Zn and Se vapors supplied to the region for epitaxial crystal growth produce a codoped GaAlInP compound semiconductor with Zn serving as a p-type dopant at an atomic ratio of Zn:Se greater than two (2) in the GaAlInP crystal.

The present invention additionally further includes a method of producing a GaAlInP compound semiconductor. The method comprises the steps of disposing a GaAs single crystal as a substrate in a metal organic vapor deposition reactor, preparing Al, Ga, In vapors by thermally decomposing organometallic compounds of Al, Ga, and In, preparing P vapors by thermally decomposing phosphine gas, preparing group II element vapors by thermally decomposing an organometallic group IIA or IIB compound, preparing group VIB vapors by thermally decomposing a gaseous compound of group VIB, simultaneously supplying the Al, Ga, In, P, group II, and group VIB vapors to a region for epitaxial crystal growth on the substrate, and epitaxially growing a GaAlInP crystal doped with group IIA or IIB and group VIB elements on said substrate wherein the group IIA or IIB and group VIB vapors supplied to the region for epitaxial crystal growth produce a codoped GaAlInP compound semiconductor with a group IIA or IIB element serving as a p-type dopant having low group II atomic diffusion at an atomic ratio of II:VI greater than approximately two (2) in the GaAlInP crystal.

The present invention further includes a GaAlInP compound semiconductor. The GaAlInP compound semiconductor comprises a substrate with the substrate being a GaAs single crystal positioned within a metal organic chemical vapor deposition (MOCVD) reactor. Al, Ga, In vapors are thermally decomposed from organometallic compounds of Al, Ga, and In. P vapors are thermally decomposed phosphine gas. Group II element vapors are thermally decomposed from an organometallic group IIA or IIB compound. Group VIB vapors are thermally decomposed from a gaseous compound of group VIB with the Al, Ga, In, P, group II, and group VIB vapors being applied to a region for epitaxial crystal growth on the substrate wherein the group IIA or IIB and group VIB produce a codoped GaAlInP compound semiconductor with a group IIA or IIB element serving as a p-type dopant having low group II atomic diffusion at an atomic ratio of II:VI greater than approximately two (2) in the GaAlInP crystal.

BRIEF DESCRIPTION OF DRAWINGS

The accompanying drawings, which are incorporated in and form a part of the specification, illustrate the preferred embodiments of the present invention, and together with the descriptions serve to explain the principles of the invention.

In the Drawings.

BEST MODE FOR CARRYING OUT THE INVENTION

The present invention is a method utilizing two (2) doping atoms, an n-type (Se) and a p-type (Zn), to increase the p-type conductivity thereby greatly enhancing the incorporation of Zn acceptor impurities in AlInP lattice-matched to GaAs compound substrates. The method of the present invention uses the simultaneous doping with both donor (Se) and acceptor (Zn) impurities to enhance the solubility of Zn and the doping level in p-type AlInP. By increasing the n-type donor to a sufficient level, the incorporation of the p-type acceptor will increase significantly thereby lowering the resistivity and increasing the conductivity of the AlInP crystal.

Figure 1:
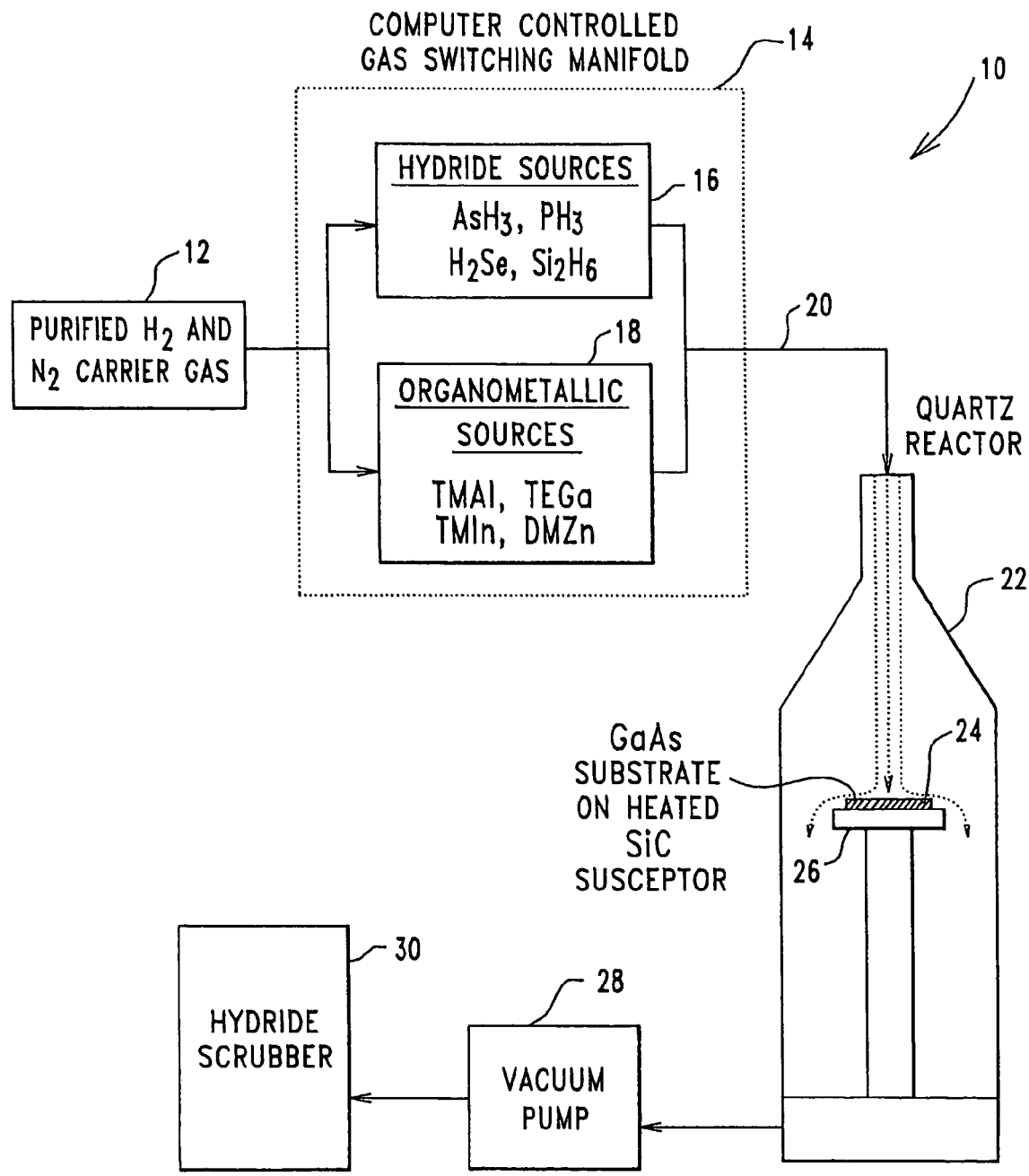
FIG. 1 is a schematic view of a metal organic chemical vapor deposition (MOVCD) reactor, constructed in accordance with the present invention.

As illustrated in FIG. 1, the AlInP epitaxial layers were grown on GaAs substrates by low-pressure metal organic chemical vapor deposition (MOCVD). It should be noted that while the present invention describes using low pressure metal organic chemical vapor deposition (MOCVD), other techniques of growing the AlInP epitaxial layers are within the scope of the present invention.

As illustrated in FIG. 1, the low pressure metal organic chemical vapor deposition (MOVCD), indicated generally at 10, feeds purified $H_2$ and $N_2$ carrier gas 12 into a computer controlled gas switching manifold 14. The carrier gas 12 flows through the gas switching manifold 14 wherein the carrier gas 12 is saturated with hydride gaseous sources 16 ($AsH_3$, $PH_3$, $H_2Se$, and $Si_2H_6$, for example) and organometallic liquid sources 18 (trimethylaluminum (TMAl), triethylgallium (TEGa), trimethylindium (TMIn), and dimethylzinc (DMZn), for example). The saturated gas 20 is then transported into a quartz reactor 22, where the saturated gas 20 impinges on a single substrate crystal 24 of GaAs resting on a heated SiC susceptor 26. Preferably, the quartz reactor 22 has a hydrogen/arsine gas ambient with the GaAs substrate crystal 24 heated to a temperature of approximately 640° C. by radio frequency induction or other means.

By controlling the amounts of Ga, Al, In, the composition of the layer deposited on the GaAs substrate crystal 24 can be determined. In the present embodiment, a 0.1 micron thick GaAs layer is deposited on the GaAs substrate crystal 24 at approximately 640° C. by introducing triethylgallium into the reactor for a controlled amount of time, i.e., approximately ten (10) minutes to produce an atomically flat surface with monolayer high steps and terraces. The GaAs substrate and epilayer are cooled to approximately 600° C. in the hydrogen/arsine gas ambient.

The gases phosphine, trimethylindium, trimethylaluminum, dimethylzinc, and hydrogen selenide are then transported into the quartz reactor 22 to deposit a p-type layer of AlInP codoped with zinc and selenium impurities. The incorporation of zinc is increased by a factor of approximately four (4) to approximately ten (10) over a layer with zinc doping only. This leads to a highly conductive p-type crystal with a stable Zn-dopant profile, i.e., Zn atomic diffusion in the Zn and Se codoped layer is greatly reduced compared to the a Zn-doped layer only.

A vacuum pump 28 can be connected to the quartz reactor 22 to reduce the pressure within the quartz reactor 22 and a hydride scrubber 30 can be connected to the quartz reactor 22 to remove any residual gases which are not decomposed.

The AlInP epitaxial layers were simultaneously doped with Zn from DMZn and Se (from $H_2Se$). Up to a six-fold increase in the atomic Zn concentrations up to $8\times10^{20}$ $cm^{-3}$ were obtained. Reduced Zn outdiffusion from codoped layers with high Zn concentrations were also obtained. Codoped AlInP with high hole concentrations of up to $6\times10^{19}$ $cm^{-3}$ with corresponding low resistivities of 0.26 ohm-cm were obtained. This codoping method of the present invention can also use other donor-acceptor pairs such as Mg or Be acceptors atoms and S or Te donor atoms.

EXAMPLES

The following examples illustrate the group II acceptor doping enhancement by codoping AlInP with a group IIA acceptor and a group VIB donor. In these examples, Zn is used as the group II acceptor and Se is used as the group VI donor although other group II acceptors and other group VI donors are within the scope of the present invention.

Example 1

A GaAs single crystal with a 511A crystallographic orientation was used as a substrate for the growth of an AlInP single crystal and was located in a metal organic chemical vapor deposition (MOCVD) reactor held at seventy-five (75) torr. AlInP single crystals closely lattice matched to the GaAs were epitaxially grown at temperatures of 540° C.-600° C. by supplying 0.4 sccm of trimethylaluminum, 0.22 sccm of trimethylindium, and 250 sccm of phosphine in ten (10) slm of hydrogen carrier gas. Zn doping was accomplished by introducing dimethylzinc at flow rates of 0.32 to 3.2 sccm. Se doping was accomplished by introducing a gas mixture consisting of 100 ppm of $H_2Se$ in hydrogen at flow rates of two (2) to one hundred (100) sccm. Various combinations of Zn doped only and Zn+Se codoped AlInP crystals were grown. The atomic Zn and Se concentrations, $N_{Zn}$ and $N_{Se}$, respectively, were measured by secondary ion mass spectroscopy (SIMS) and are summarized in Table 1. In the AlInP crystal grown at 600° C., the Zn doping level was increased from $4.5\times10^{18}$ $cm^{-3}$ in the zinc doped only crystals (samples 1-3) to $1.1$–$3.0\times10^{19}$ $cm^{-3}$ in Zn+Se codoped crystals (samples 4-6). In the AlInP crystal grown at 540° C., the Zn doping level was increased from $2\times10^{20}$ $cm^{-3}$ in the zinc doped only crystals (sample 7) to $8\times10^{20}$ $cm^{-3}$ in the Zn+Se codoped crystals (sample 8).

| Sample | Temperature (° C.) | DMZn flowrate (sccm) | $H_2Se$ flowrate (sccm) | $N_{Se}$ ($cm^{-3}$) | $N_{Zn}$ ($cm^{-3}$) |
|---|---|---|---|---|---|
| 1 | 600 | 0.32 | 0 | 0 | $4.5 \times 10^{18}$ |
| 2 | 600 | 1.6 | 0 | 0 | $4.5 \times 10^{18}$ |
| 3 | 600 | 3.2 | 0 | 0 | $4.5 \times 10^{18}$ |
| 4 | 600 | 0.32 | 2 | $2.8 \times 10^{18}$ | $1.1 \times 10^{19}$ |
| 5 | 600 | 0.32 | 5 | $6.5 \times 10^{18}$ | $1.7 \times 10^{19}$ |
| 6 | 600 | 0.32 | 10 | $1.1 \times 10^{19}$ | $3 \times 10^{19}$ |
| 7 | 540 | 0.32 | 0 | 0 | $2 \times 10^{20}$ |
| 8 | 540 | 0.32 | 100 | $2.5 \times 10^{20}$ | $8 \times 10^{20}$ |

Example 2

Figure 2:
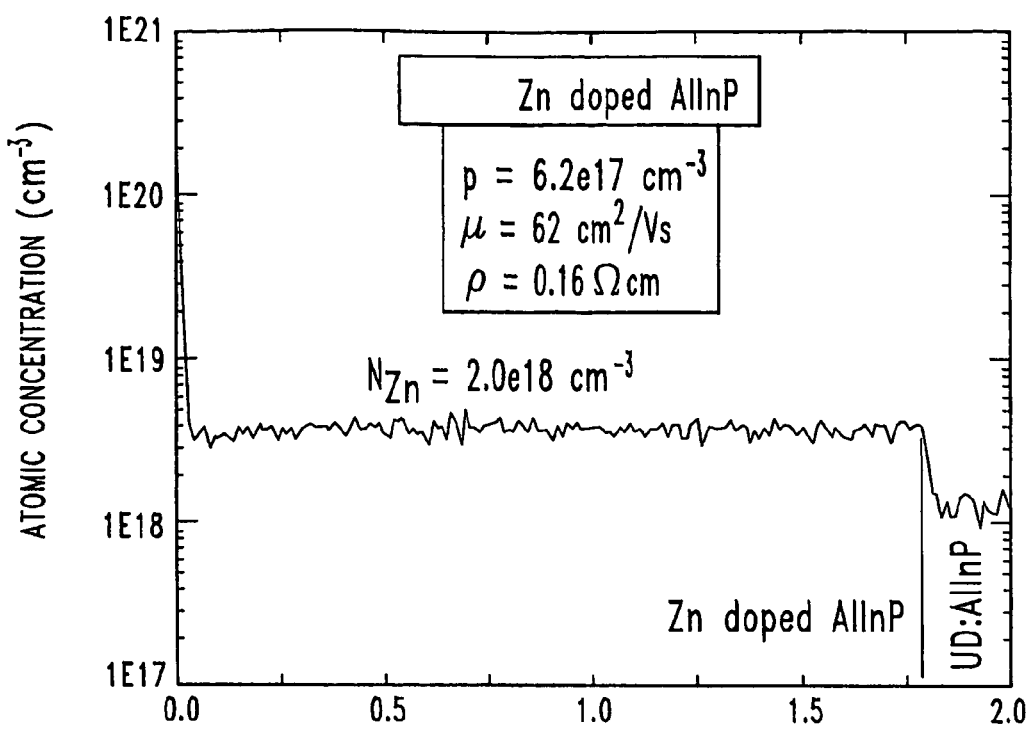
FIG. 2 is a graph of a secondary ion mass spectroscopy (SIMS) profile of the atomic Zn concentration in an AlInP crystal doped with Zn only and the measured electrical properties.
Figure 3:
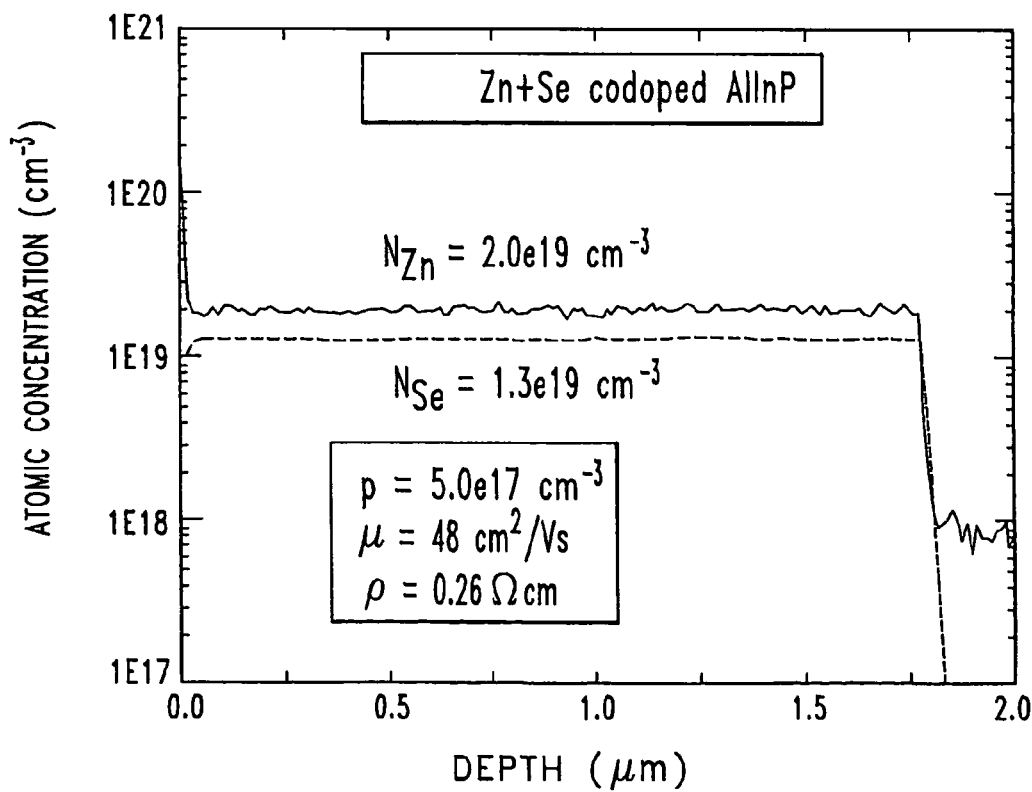
FIG. 3 is a graph of a secondary ion mass spectroscopy (SIMS) profile of the atomic Zn and Se concentrations in an AlInP crystal codoped with Zn and Se and the measured electrical properties illustrating that low resistivity p-type AlInP was obtained.

A GaAs single crystal with a 511A crystallographic orientation was used as a substrate for the growth of an AlInP single crystal and was located in a metal organic chemical vapor deposition (MOCVD) reactor at held seventy-five (75) torr. Zn doped only and Zn+Se codoped AlInP single crystals closely lattice matched to the GaAs were epitaxially grown on an undoped AlInP buffer layer at temperature of 600° C. by supplying 0.4 sccm of trimethylaluminum, 0.22 sccm of trimethylindium, and 250 sccm of phosphine in ten (10) slm of hydrogen carrier gas. Zn doping was accomplished by introducing dimethylzinc at flow rate of 1.6 sccm. Se doping was accomplished by introducing a gas mixture consisting of 100 ppm of $H_2Se$ in hydrogen at a flow rate of ten (10) sccm. The profiles of atomic Zn and Se concentrations, $N_{Zn}$ and $N_{Se}$, respectively, in Zn doped only and Zn+Se codoped AlInP single crystals were measured by secondary ion mass spectroscopy (SIMS) and are illustrated in FIGS. 2 and 3, respectively. The hole concentration, p, the mobility, μ, AND THE HOLE RESISTIVITY, ρ, WERE MEASURED BY THE HALL EFFECT AND ARE ILLUSTRATED IN FIGS. 2 AND 3. IN THE ZINC DOPED ALINP crystal, the Zn doping level was $N_{Zn}=3.5\times10^{18}$ cm$^{-3}$, p=$6.2\times10^{17}$ cm$^{-3}$, μ=62 Vs/cm$^2$, and ρ=0.16 Ωcm. In the Zn+Se codoped AlInP crystal, the Zn doping level increased to $N_{Zn}=2\times10^{19}$ cm$^{-3}$, while the hole concentration, mobility, and resistivity were p=$5\times10^{17}$ cm$^{-3}$, μ=48 Vs/cm$^2$, ρ=0.26 Ωcm. These results demonstrated that low p-type resistivity was obtained in Zn+Se codoped AlInP.

Example 3

Figure 4:
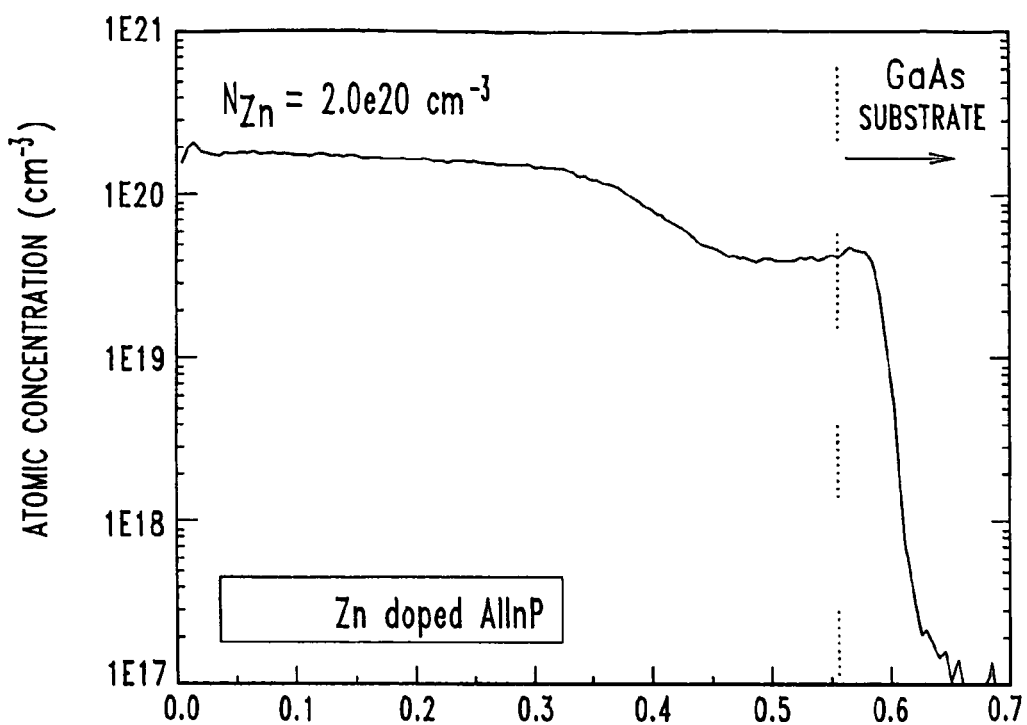
FIG. 4 is a graph of a secondary ion mass spectroscopy (SIMS) profile of the atomic Zn concentration in a highly Zn-doped AlInP crystal doped with Zn only illustrating significant Zn diffusion from AlInP layer into the GaAs substrate.
Figure 5:
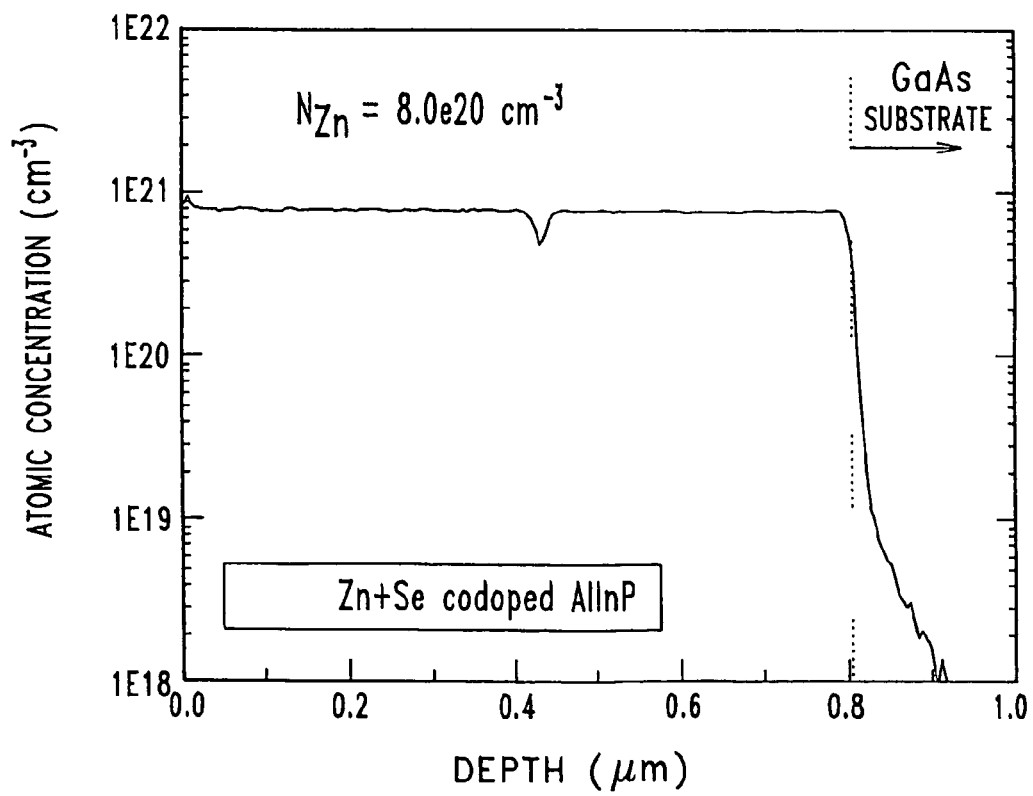
FIG. 5 is a graph of a secondary ion mass spectroscopy (SIMS) profile of the atomic Zn concentration in a highly Zn-doped AlInP crystal codoped with Zn and Se illustrating greatly reduced Zn diffusion compared to FIG. 4.

A GaAs single crystal with a 511A crystallographic orientation was used as a substrate for the growth of an AlInP single crystal and was located in a metal organic chemical vapor deposition (MOCVD) reactor at held seventy-five (75) torr. Very heavily Zn doped AlInP single crystals closely lattice matched to the GaAs were epitaxially grown at temperature of 540° C. by supplying 0.4 sccm of trimethylaluminum, 0.22 sccm of trimethylindium, and 400 sccm of phosphine in ten (10) slm of hydrogen carrier gas. Zn doping was accomplished by introducing dimethylzinc at a flow rate of 0.32 sccm. Se doping was accomplished by introducing a gas mixture consisting of 100 ppm of $H_2Se$ in hydrogen at a flow rate of one hundred (100) sccm. The profiles of atomic Zn and Se concentrations, $N_{Zn}$ and $N_{Se}$, respectively, in Zn doped only and Zn+Se codoped AlInP single crystals were measured by secondary ion mass spectroscopy (SIMS) and are illustrated in FIG. 4 and FIG. 5, respectively. At these high Zn concentrations, significant Zn diffusion from the AlInP crystal into the GaAs substrate crystal occurs as shown in FIG. 4 in the Zn-doped only AlInP crystal. An diffusion is greatly reduced in the codoped AlInP crystal as illustrated in FIG. 5, resulting in a very sharp Zn dopant profile even though the Zn concentration is four times larger that the case of FIG. 4.

The present invention uses reactive codoping to enhance incorporation of Zn acceptor impurities in AlInP lattice-matched to GaAs substrates. The present invention additionally uses the simultaneous doping with both donor (Se) and acceptor (Zn) impurities to enhance the solubility of Zn and the doping level in p-type AlInP. The present invention finds industrial applicability in the use of GaAlInP compound semiconductors for: a high gap top-cell, window layer, tunnel junction, or back-surface field layer of tandem solar cells; red to yellow-green high brightness visible LEDs for energy efficient traffic signals; and visible laser diodes for digital video disc technology. Crystal production uses the molecular beam epitaxy (MBE) process or a metal organic chemical vapor deposition (MOCVD) process.

The compound semiconductor alloy GaAlInP of the present invention has widespread technological and commercial applications in optoelectronic devices such as tandem solar cells, high brightness visible LEDs, and in visible laser diodes. The present invention utilizes codoping of AlInP with Zn and Se to enhance Zn incorporation and stabilize Zn diffusion in highly p-type dopes AlInP.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

The invention claimed is:

1. A method of producing a GaAlInP compound semiconductor, the method comprising the steps of:
    disposing a GaAs single crystal as a substrate in a metal organic chemical vapor deposition (MOCVD) reactor;
    preparing Al, Ga, In vapors by thermally decomposing organometallic compounds of Al, Ga, and In;
    preparing Zn vapors by thermally decomposing an organometallic Zn compound;
    preparing P vapors by thermally decomposing phosphine gas;
    simultaneously supplying the Al, Ga, In, P, Se, and Zn vapors to a region for epitaxial crystal growth on the substrate; and
    epitaxially growing a GaAlInP crystal doped with Zn and Se on the substrate;
    wherein flow rates of the Zn and Se vapors supplied to the region for epitaxial crystal growth are controlled to produce a heavily doped GaAlInP compound semiconductor with Zn serving as a p-type dopant at an atomic ratio of Zn:Se greater than two in the GaAlInP crystal.

2. The method of claim 1 and further comprising:
    providing a gas switching manifold in the metal organic chemical vapor deposition (MOCVD) reactor; and
    preparing the Al, Ga, In vapors in the gas switching manifold.

3. The method of claim 1 and further comprising:
    providing a gas switching manifold in the metal organic chemical vapor deposition (MOCVD) reactor; and
    preparing the Zn vapors in the gas switching manifold.

4. The method of claim 1 and further comprising:
    providing a gas switching manifold in the metal organic chemical vapor deposition (MOCVD) reactor; and
    preparing the P vapors in the gas switching manifold.

5. The method of claim 1 and further comprising:
    providing a reaction chamber in the metal organic chemical vapor deposition (MOCVD) reactor;
    positioning a susceptor within the reaction chamber;
    positioning the substrate on the susceptor; and
    heating the substrate.

6. The method of claim 5 and further comprising:
    heating the substrate to a temperature of between approximately 500° C. and 650° C.

7. The method of claim 1 wherein the hydride sources are selected from the group consisting of $AsH_3$, $PH_3$, $H_2Se$, and $Si_2H_6$.

8. The method of claim 1 wherein the organometallic compounds are organometallic sources selected from the group consisting of trimethylaluminum (TMAl), triethylgallium (TEGa), trimethylindium (TMIn), and dimethylzinc (DMZn).

9. The method of claim 1 and further comprising:
    epitaxially growing a codoped GaAlInP layer by exposing the heated substrate to Al, Ga, In, P, Zn, and Se vapors.

10. A method of producing a GaAlInP compound semiconductor, the method comprising the steps of:
disposing a GaAs single crystal as a substrate in a metal organic vapor deposition reactor;
preparing Al, Ga, In vapors by thermally decomposing organometallic compounds of Al, Ga, and In;
preparing P vapors by thermally decomposing phosphine gas;
preparing group II element vapors by thermally decomposing an organometallic group IIA or IIB compound;
preparing group VIB vapors by thermally decomposing a gaseous compound of group VIB;
simultaneously supplying the Al, Ga, In, P, group II, and group VIB vapors to a region for epitaxial crystal growth on the substrate; and
epitaxially growing a GaAlInP crystal doped with group IIA or IIB and group VIB elements on said substrate;
wherein the group IIA or IIB and group VIB vapors supplied to the region for epitaxial crystal growth produce a codoped GaAlInP compound semiconductor with a group IIA or IIB element serving as a p-type dopant having low group II atomic diffusion at an atomic ratio of II:VI greater than approximately two (2) in the GaAlInP crystal.

11. The method of claim 10 and further comprising:
providing a gas switching manifold in the metal organic chemical vapor deposition (MOCVD) reactor; and
preparing the Al, Ga, In vapors in the gas switching manifold.

12. The method of claim 10 and further comprising:
providing a gas switching manifold in the metal organic chemical vapor deposition (MOCVD) reactor; and
preparing the group II element vapors in the gas switching manifold.

13. The method of claim 10 and further comprising:
providing a gas switching manifold in the metal organic chemical vapor deposition (MOCVD) reactor; and
preparing the P vapors in the gas switching manifold.

14. The method of claim 10 and further comprising:
providing a gas switching manifold in the metal organic chemical vapor deposition (MOCVD) reactor; and
preparing the group VIB vapors in the gas switching manifold.

15. The method of claim 10 and further comprising:
providing a reaction chamber in the metal organic chemical vapor deposition (MOCVD) reactor;
positioning a susceptor within the reaction chamber;
positioning the substrate on the susceptor; and
heating the substrate.

16. The method of claim 15 and further comprising:
heating the substrate to a temperature of between approximately 500° C. and 650° C.

17. The method of claim 10 wherein the hydride sources are selected from the group consisting of $AsH_3$, $PH_3$, $H_2Se$, and $Si_2H_6$.

18. The method of claim 10 wherein the organometallic compounds are organometallic sources selected from the group consisting of trimethylaluminum (TMAl), triethylgallium (TEGa), trimethylindium (TMIn), and dimethylzinc (DMZn).

19. The method of claim 12 and further comprising:
spitaxially growing a codoped GaAlInP layer by exposing the heated substrate to Al, Ga, In, P, group IIA or group IIB, and group VIB vapors.

* * * * *